(12) United States Patent
Yao et al.

(10) Patent No.: US 10,515,880 B2
(45) Date of Patent: Dec. 24, 2019

(54) LEAD FRAME WITH BENDABLE LEADS

(71) Applicant: NXP USA, INC., Austin, TX (US)

(72) Inventors: Jinzhong Yao, Tianjin (CN); Zhigang Bai, Tianjin (CN); Xingshou Pang, Tianjin (CN); Meng Kong Lye, Shah Alam (MY); Xuesong Xu, Tianjin (CN)

(73) Assignee: NXP USA, INC, Austin, TX (US)

( * ) Notice: Subject to any disclaimer, the term of this patent is extended or adjusted under 35 U.S.C. 154(b) by 0 days.

(21) Appl. No.: 16/294,923

(22) Filed: Mar. 7, 2019

(65) Prior Publication Data
US 2019/0287883 A1    Sep. 19, 2019

Related U.S. Application Data

(63) Continuation-in-part of application No. 15/922,923, filed on Mar. 16, 2018, now Pat. No. 10,181,434, and a continuation-in-part of application No. 15/980,572, filed on May 15, 2018, now Pat. No. 10,217,700.

(30) Foreign Application Priority Data

Jul. 10, 2018   (CN) .......................... 2018 1 0747720

(51) Int. Cl.
*H01L 23/495*   (2006.01)
*H01L 23/00*    (2006.01)
*H01L 23/31*    (2006.01)

(52) U.S. Cl.
CPC .... *H01L 23/49548* (2013.01); *H01L 23/3107* (2013.01); *H01L 23/49503* (2013.01); *H01L 23/49517* (2013.01); *H01L 23/49558* (2013.01); *H01L 24/48* (2013.01); *H01L 2224/48245* (2013.01)

(58) Field of Classification Search
CPC .......... H01L 23/49548; H01L 23/3107; H01L 24/48
USPC ........................................ 257/676, 682, 695
See application file for complete search history.

(56) References Cited

U.S. PATENT DOCUMENTS

| | | | |
|---|---|---|---|
| 4,801,765 A | 1/1989 | Moyer et al. |
| 5,406,119 A | 4/1995 | Numada |
| 5,594,234 A | 1/1997 | Carter, Jr. et al. |
| 6,674,154 B2 | 1/2004 | Minamio et al. |
| 7,211,471 B1 | 5/2007 | Foster |
| 7,808,084 B1 | 10/2010 | Lee et al. |
| 8,525,311 B2 | 9/2013 | Bai et al. |
| 8,859,339 B2 | 10/2014 | Bai et al. |
| 8,901,721 B1 | 12/2014 | Bai et al. |
| 9,190,351 B2 | 11/2015 | Bai et al. |
| 2006/0220191 A1* | 10/2006 | Sundstrom ........ H01L 23/49541 257/669 |

(Continued)

*Primary Examiner* — Bo Fan

(57) ABSTRACT

A lead frame for a packaged integrated circuit (IC) device has a die receiving area and leads that extend outwardly from the die receiving area. The leads have an inner lead area proximate the die receiving area and an outer lead area distant from the die receiving area. Notches are formed in a surface of alternate ones of the leads, in the inner lead area proximate to the outer lead area. The notches facilitate bending of the alternate leads when the leads are subjected to a downward force by a mold tool, such that one set of leads lies in a first plane and another set of leads lies in a second plane spaced from the first plane. The leads in the first plane can be formed into Gull Wing leads and the other set of leads into J-leads.

20 Claims, 4 Drawing Sheets

(56) References Cited

U.S. PATENT DOCUMENTS

2013/0292815 A1* 11/2013 Tashiro ................ H01L 23/495
                                                                  257/676
2015/0014793 A1   1/2015  Yow et al.
2016/0284632 A1   9/2016  Shinohara et al.
2017/0110341 A1   4/2017  Onoda et al.

* cited by examiner

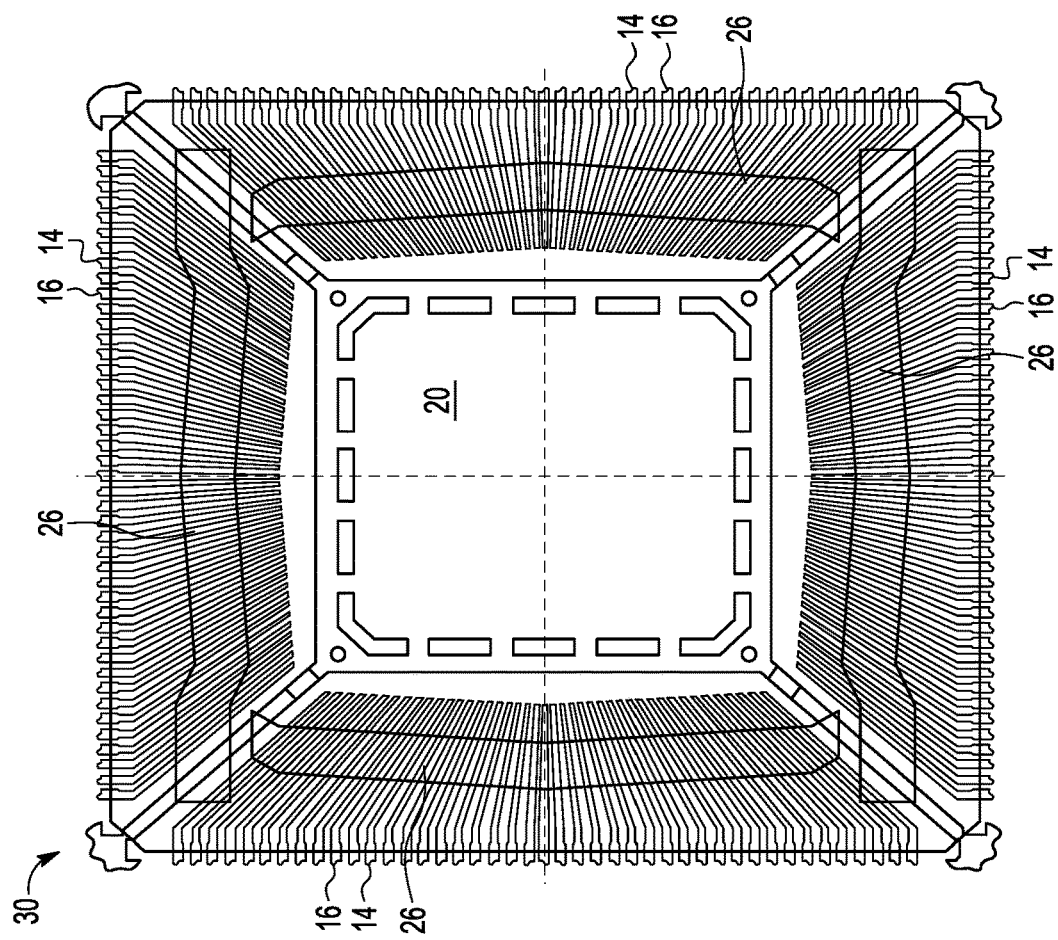
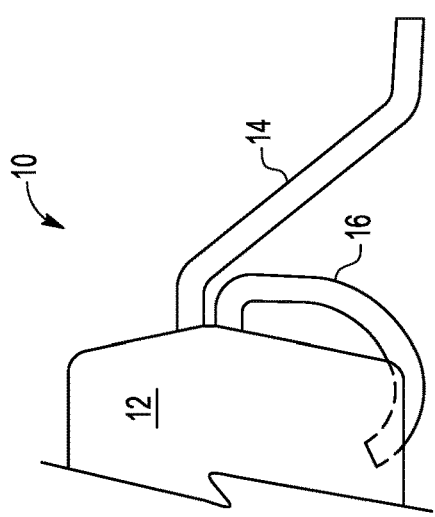
FIG. 1
- PRIOR ART -
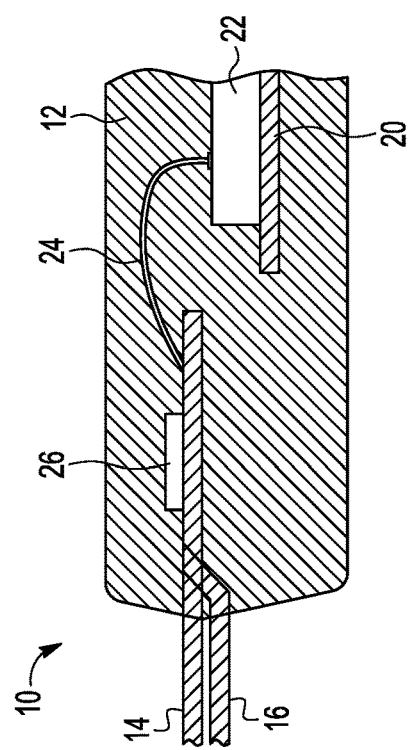
FIG. 3
- PRIOR ART -
FIG. 2
- PRIOR ART -

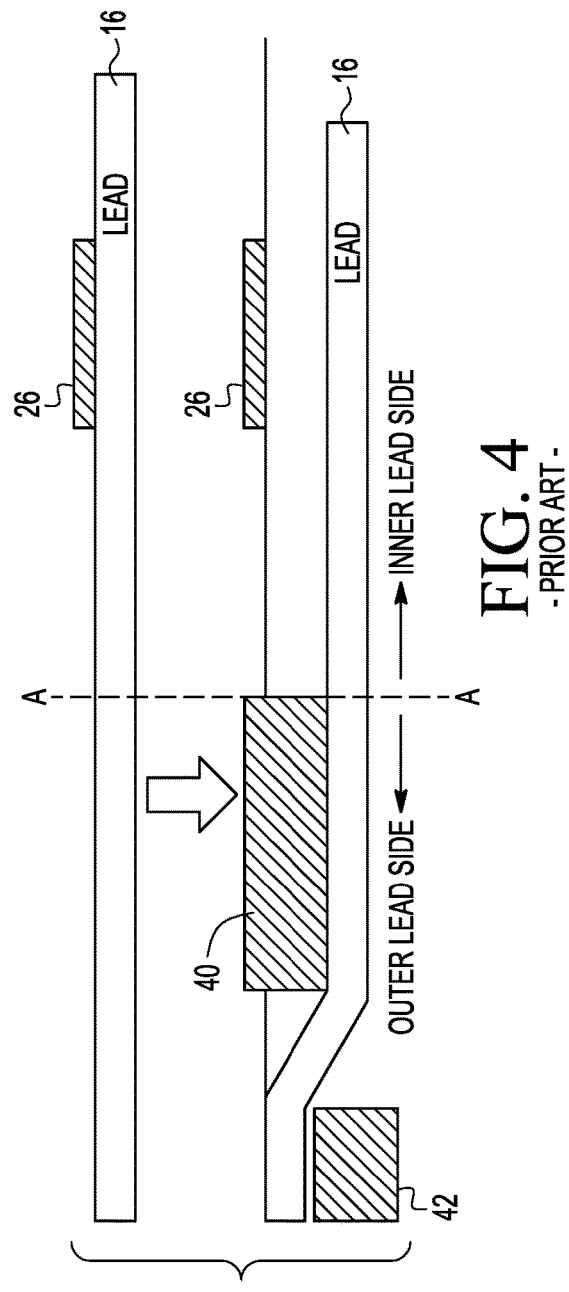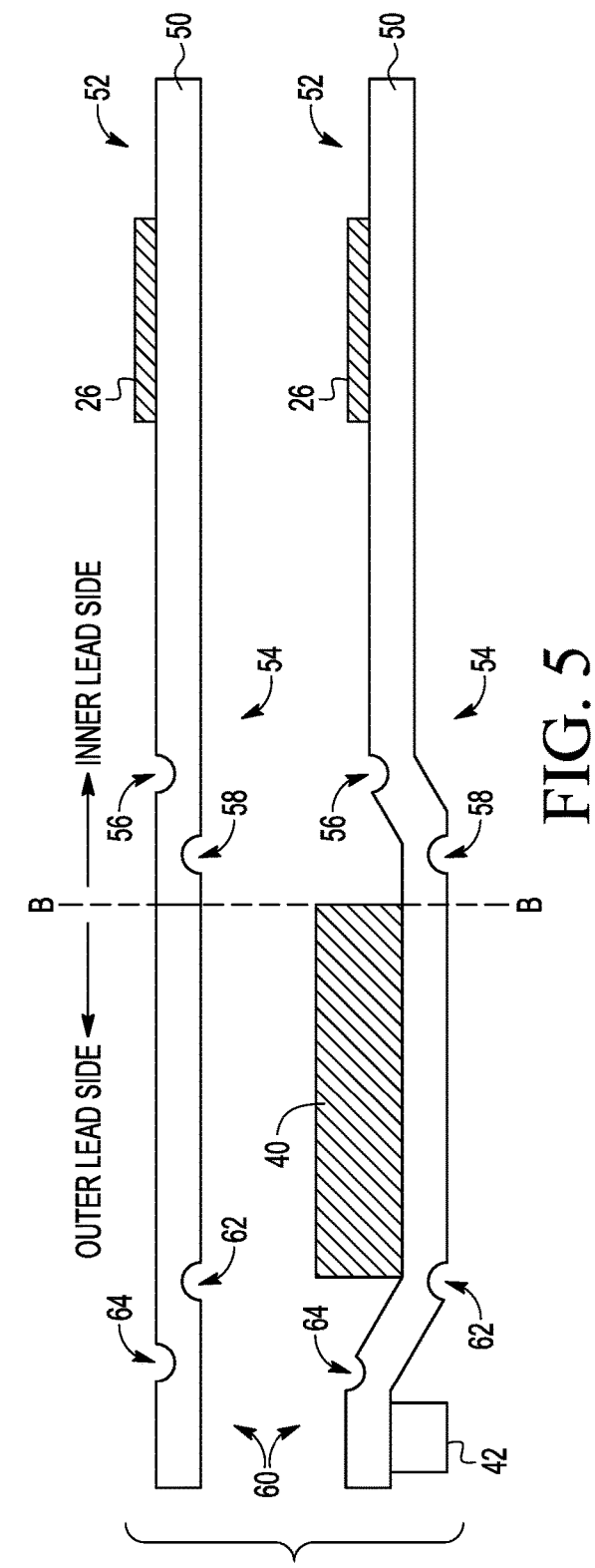

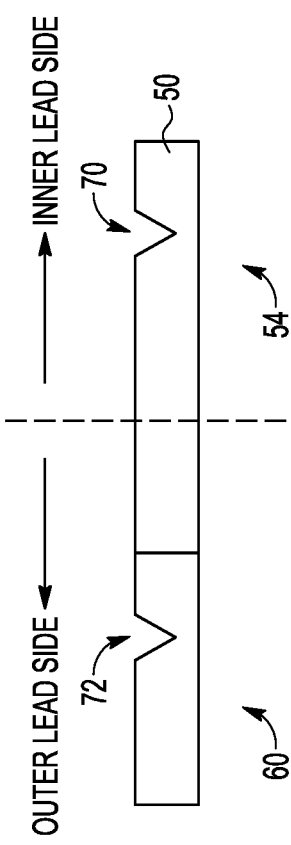
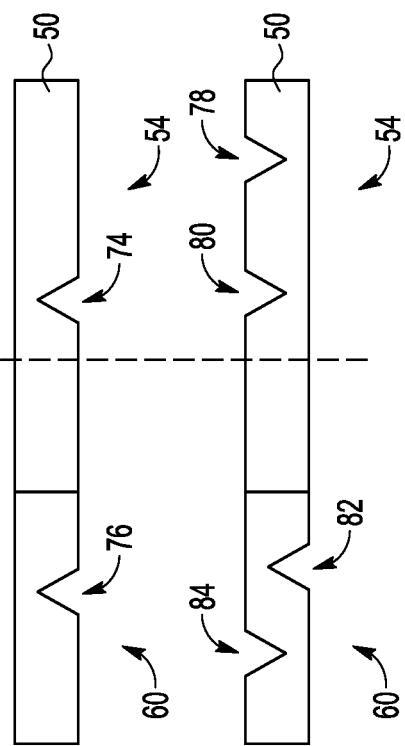
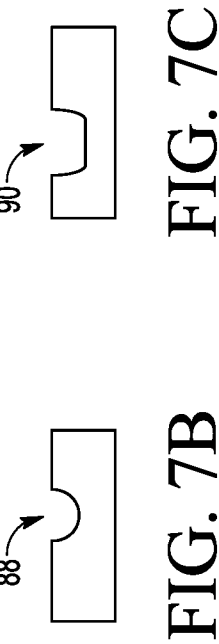
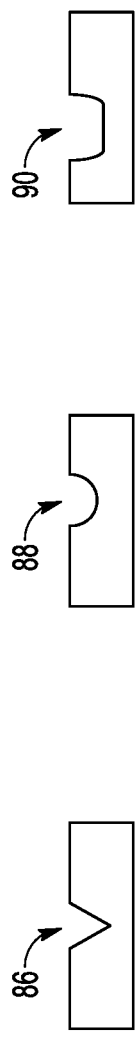

LEAD FRAME WITH BENDABLE LEADS

CROSS-REFERENCE TO RELATED APPLICATIONS

The present invention is related to commonly owned U.S. patent application Ser. No. 15/922,923 filed on Mar. 18, 2018 and Ser. No. 15/980,572 filed on May 15, 2018.

BACKGROUND

The present invention relates to integrated circuit (IC) packaging, and more particularly to a lead frame for an integrated circuit device having both J-leads and Gull Wing leads.

FIG. 1 is a side view of a portion of a semiconductor device 10 comprising a plastic body 12 that houses one or more integrated circuits, and a plurality of leads projecting from a side thereof, where two such leads 14 and 16 are shown. The plastic body 12 protects the integrated circuit, while the leads 14 and 16 allow for external electrical connection to the integrated circuit. In order to allow adjacent leads to be located close together (i.e., to reduce lead pitch), and therefore have more leads spaced around the body 12, some of the leads, like the lead 14, are bent outward, and other ones of the leads are bent inward, like lead 16. The outward bending leads are known as Gull Wing leads and the inward bending leads are known as J-leads. It also should be noted that the Gull Wing leads 14 project from the side of the package body 12 at a different plane than the J-leads 16.

FIG. 2 is a cross-sectional side view of the package 10 prior to bending of the leads 14 and 16. It can be seen that the package 10 includes a flag 20 and an integrated circuit die 22 attached to a surface of the flag 20. The die 22 is electrically connected to the leads 14 and 16 with bond wires 24. There also is a tape 26 placed on an upper surface of the leads 14 and 16 to keep adjacent leads spaced from each other.

FIG. 3 is a top plan view of a lead frame 30 used to assemble the integrated circuit device 10 of FIGS. 1 and 2. The lead frame 30 comprises the generally rectangular die pad 20 surrounded by the leads 14 and 16. As noted above, adjacent leads 14 and 16 are very close to one another. To prevent adjacent leads from bending or coming into contacting with one another, the tape 26 is placed over the leads to hold them in place.

FIG. 4 illustrates formation of one of the J-leads 16 during a molding process in which the plastic body 12 is formed. In the upper half of the drawing, the lead 16 is shown prior to insertion into a mold, and in the lower half of the drawing, the lead 16 is shown interacting with mold tooling 40 and 42. The lead 16 has an inner lead side that is proximate to the die pad 20, and an outer lead side that is distant from the die pad 20. The dashed line A-A indicates the boundary of the package body 12, separating the inner and outer lead sides of the lead 16. The tape 26 is placed over the inner lead side to keep adjacent leads separated from each other. As shown in the lower half of FIG. 4, a portion 40 of the mold tooling presses down on the outer lead side of the lead 16, close to the inner lead side, while a distal end of the outer lead portion of the lead 16 is clamped with another portion 42 of the mold tooling. The mold tooling 40 and 42 offsets adjacent leads at the package body, so that the Gull Wing leads 14 and the J-leads 16 are vertically offset where they project from the package body 12, as shown in FIGS. 1 and 2.

Unfortunately, this pressing and lead deformation can cause the tape 26 to separate from the leads 16, as shown in the lower half of FIG. 4, where the tape is above the lead 16 because the lead 16 was pressed down by the mold tooling 40. Accordingly, a minimum lead pitch requirement may be violated or worse yet, one of the Gull Wing leads 14 may contact an adjacent J-lead 16, causing an electrical short circuit. Accordingly, it would be advantageous to have a lead frame and/or a method of preventing such a rule violation or short circuit condition.

BRIEF DESCRIPTION OF THE DRAWINGS

Aspects, features, and advantages of the invention will become fully apparent from the following detailed description, the appended claims, and the accompanying drawings in which like reference numerals identify similar or identical elements. Certain elements shown in the drawing may be exaggerated, and thus not drawn to scale, in order to more clearly present the invention FIG. 1 is an enlarged side view of a portion of a conventional integrated circuit device that has both J-leads and Gull Wing leads;

FIG. 2 is an enlarged cross-sectional side view of a portion of the conventional integrated circuit device of FIG. 1 before forming the J-leads and Gull Wing leads;

FIG. 3 is an enlarged top plan view of a lead frame of the conventional integrated circuit device of FIGS. 1 and 2;

FIG. 4 is a greatly enlarged side view of a J-lead of the lead frame of FIG. 3 during assembly of the conventional integrated circuit device of FIG. 1;

FIG. 5 is a greatly enlarged side view of a J-lead of a lead frame in accordance with an embodiment of the present invention during assembly of an integrated circuit device in accordance with the present invention;

FIGS. 6A, 6B and 6C are side views of various embodiments of a J-lead of a lead frame in accordance with the present invention;

FIGS. 7A, 7B and 7C are side views illustrating various embodiments of notches formed in leads of a lead frame in accordance with the present invention.

DETAILED DESCRIPTION

Figure 8:
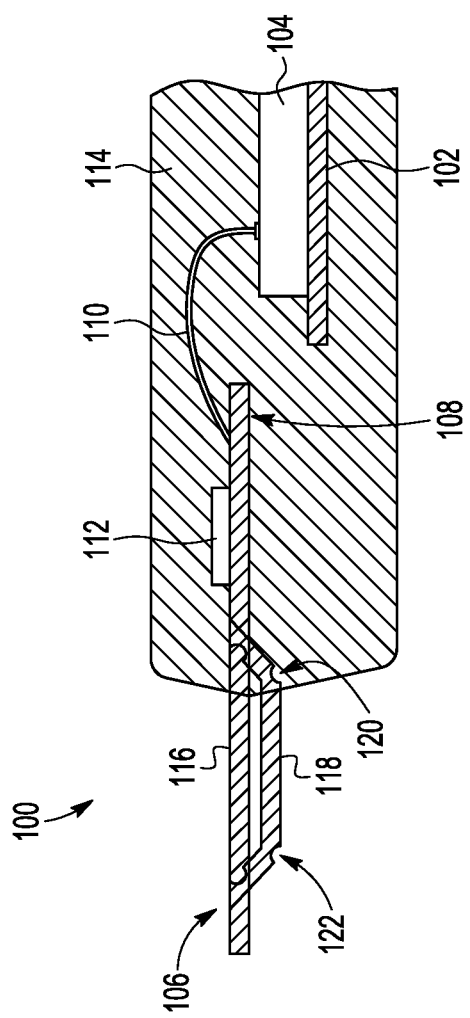
FIG. 8 is a side cross-sectional view of a portion of a packaged integrated circuit in accordance with the present invention.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, the present invention provides a lead frame an integrated circuit device. The lead frame includes a central die receiving area for receiving at least one integrated circuit die, and a plurality of leads that surround the die receiving area and extend outwardly therefrom. Each lead has an inner lead area proximate to the die receiving area, and an outer lead area distant from the die receiving area. The inner lead areas have electrical connection areas proximate to the die receiving area that are configured for electrical connection to a bonding pad of an integrated circuit die. The outer lead areas extend beyond a package boundary and allow for electrical connection of external circuitry to the integrated circuit die. The inner lead area proximate to the outer lead area of at least one of the leads includes a first notch formed in a surface thereof that facilitates bending of the at least one lead when the at least one lead is subjected to a downward force by a mold tool at the outer lead area.

In another embodiment, the present invention provides a packaged integrated circuit die, including a central die receiving area for receiving an integrated circuit die, and an integrated circuit die disposed within the die receiving area. A plurality of leads surrounds the die receiving area and the die. The leads extend outwardly from the die receiving area. Each lead has an inner lead area proximate to the die receiving area and an outer lead area distant from the die receiving area. The inner lead areas have electrical connection areas proximate to the die receiving area that are configured for electrical connection to bonding pads of the integrated circuit die. The outer lead areas extend beyond a package boundary and allow for electrical connection of external circuitry to the integrated circuit die. The inner lead areas proximate to the outer lead areas of a first set of the plurality of leads include a first notch formed in a surface thereof that facilitates bending of the leads of the first set when the leads of the first set are subjected to a downward force at their outer lead areas. A plurality of interconnections electrically connects bonding pads disposed on a top surface of the integrated circuit die with the electrical connection areas of the leads. A mold compound covers the integrated circuit die, the plurality of interconnections, and the inner lead areas of the plurality of leads. The mold compound defines a package body, and the outer lead areas of the plurality of leads project outwardly from sides of the package body.

The present invention provides a modification or improvement to a known lead frame used for assembling or packaging integrated circuit dies, like the lead frame referred to in FIGS. 1-4. The improvement comprises forming one or more notches or grooves at predetermined locations along a length of selected ones of the leads of a lead frame. The notches facilitate bending of the selected leads at the predetermined locations. In one preferred embodiment, alternate leads of a lead frame used for assembling a device having both Gull Wing leads and J-leads include first notches located near a boundary of an inner lead area with an outer lead area. When the lead frame is placed in a mold, mold tools press on the alternate leads in the outer lead area so that the alternate leads will project from the package body in a plane that is parallel to and spaced from a plane from which the other leads project.

A lead frame in accordance with the present invention thus includes a plurality of leads (e.g., leads 14 and 16 shown in FIG. 1) surrounding a die receiving area, such as the die pad 20 (FIG. 1). The leads 14 and 16 extend outwardly from the die pad 20. Each of the leads 14 and 16 has an inner lead area proximate to the die receiving area 20 and an outer lead area distant from the die receiving area 20. In the presently preferred embodiment, the die receiving area 20 comprises a metal die pad.

Referring now to FIG. 5, in a top half of the drawing, a lead 50 of a lead frame is shown, where in one embodiment, the lead 50 will be formed into a J-lead, like the J-lead 16 shown in FIG. 1. The lead 50 has an inner lead side, an outer lead side, and a boundary of a package body that delineates the inner and outer lead sides, indicated by line B-B. The terms inner lead side and inner lead area, and outer lead side and outer lead area, have the same respective meanings and may be used interchangeably herein. The inner lead side has an electrical connection area 52 located at one end of the inner lead side that is adjacent or near to a die pad or die receiving area (e.g., die pad 20 shown in FIG. 3). The electrical connection area 52, in one embodiment, receives one end of a bond wire (e.g., bond wire 24 shown in FIG. 2) that extends between and electrically connects an electrode or bonding pad of an integrated circuit die with the electrical connection area 52 of the lead 50.

A tape 26 is placed over and adhered to an upper or top surface of the lead 50 on the inner lead side proximate to the electrical connection area 52. One purpose of the tape 26 is to keep the lead 50 from contacting adjacent leads, as discussed above with reference to FIG. 3. The tape 26 also maintains the inner lead sides of the leads in a first plane.

The lead 50 also includes a first notch 54 formed in a surface thereof that facilitates bending of the lead 50 when the lead 50 is subjected to an orthogonal force at the outer lead area, such that the tape 26 remains adhered to the top surface of the inner lead area in the first plane while the outer lead area is displaced to a second plane that is parallel to and spaced from the first plane. In one embodiment, the first notch 54 is located in the inner lead area proximate to the outer lead area, or in the inner lead area near to the package boundary B-B. Thus, the tape 26 is located between the electrical connection area 52 and the first notch 54.

The first notch 54 allows the lead to be bent, as shown in the lower half of FIG. 5, and thus the first notch 54 defines a predetermined bending position of the lead 50. In one embodiment, the first notch 54 comprises a notch 56 formed in the upper surface of the lead. In another embodiment, the first notch 54 comprises the notch 56 and another notch 58, where the notch 58 is formed on a bottom surface of the lead 50. That is, the notch 58 is formed on a surface opposite to the notch 56. The notch 58 also is offset from the notch 56 so that when the lead 50 is bent, it does not break.

In one embodiment, the lead 50 includes a second notch 60 formed in the outer lead area that facilitates bending of the lead 50 at a second predetermined location when the lead 50 is subjected to an orthogonal force at the outer lead area near to the second notch 60. Referring to the lower half of FIG. 5, when the lead frame is placed in a mold, first and second mold tools 40 and 42 are pressed against the top and bottom surfaces, respectively, of the lead 50 in the outer lead side near to the first and second notches 54 and 60. The notches 54 and 60 allow the lead to be bent without overly stressing the lead 50. The first notch 54 also dissipates the force on the lead 50 so that it is bent at the notch 54, but does not cause the inner lead side to move downward and disengage with the tape 26.

In one embodiment, the second notch 60 comprises a notch 62 formed in the lower surface of the lead 50. In another embodiment, the second notch 60 comprises two notches, the notch 62 and another notch 64, where the notch 62 is formed on the lower or bottom surface of the lead 50 and the notch 64 is formed in the top or upper surface of the lead 50. That is, the notch 64 is formed on a surface opposite to the notch 62. The notch 64 also is offset from the notch 62 so that when the lead 50 is bent, it does not break.

FIGS. 6A, 6B and 6C illustrate various embodiments of the lead 50 including first and second notches 54 and 60. In FIG. 6A, the first notch 54 comprises one notch or groove 70 formed in an upper surface of the lead 50, and the second notch 60 also comprises one notch or groove 72 formed in the upper surface of the lead 50. In FIG. 6B, the first notch 54 comprises one notch or groove 74 formed in a lower surface of the lead 50, and the second notch 60 also comprises one notch or groove 76 also formed in the lower surface of the lead 50. In FIG. 6C, the first notch 54 comprises two notches or grooves 78 and 80 both formed in the upper surface of the lead 50, and the second notch 60 comprises two notches or grooves 82 and 84 formed in opposing lower and upper surfaces of the lead 50. Thus, as can be seen, the first and second notches 54 and 60 may comprise one or more notches each, and the one or more notches may be formed either on the same surface of the lead or opposite surfaces. The notches 54 and 60 may be formed anywhere along the surface of the lead 50 to define predetermined bending positions.

FIGS. 7A, 7B and 7C illustrate various embodiments of the first and second notches, in cross-section. In FIG. 7A, a notch 86 having a triangular cross-section is formed. In FIG. 7B, a notch 88 having a circular cross-section is formed. In FIG. 7C, a notch 90 having a rectangular cross-section is formed. In a presently preferred embodiment, the notches 78, 88, 90 are formed by etching. However, the notches may be formed by other methods, such as cutting or stamping.

FIG. 8 is an enlarged cross-sectional view of a portion of a semiconductor IC package 100 having both J-leads and Gull Wing leads, in accordance with the present invention. The package 100 is assembled using a lead frame having a central die receiving area 102 for receiving at least one integrated circuit die 104. The integrated circuit die 104 is attached to a top surface of the die receiving area 102 with a die attach adhesive (not shown), as is known in the art.

A plurality of leads 106 surround the die receiving area 102 and extend outwardly therefrom. Each lead has an inner lead area near to the die receiving area 102 and an outer lead area distant from the die receiving area 102. The inner lead area has an electrical connection area 108 proximate to the die receiving area 102 configured for electrical connection to a bonding pad of the integrated circuit die 104. The outer lead area extends beyond a package boundary and allows for electrical connection of external circuitry to the integrated circuit die 104.

A plurality of interconnections electrically connects bonding pads disposed on a top surface of the integrated circuit die 104 with the electrical connection areas 108 of the plurality of leads 106. In the embodiment shown, the interconnections comprise bond wires 110.

A tape 112 is disposed over a top surface of the inner lead areas of the leads 106. The tape 112 maintains the leads 106 in a first plane and prevents adjacent leads from contacting each other. Thus, the tape 112 prevents the leads 106 from moving in either the Y or Z axis directions.

A mold compound 114 covers the integrated circuit die 104, the bond wires 110, the inner lead areas of the leads 106, and the tape 112. The mold compound 114 protects the die 104 and the wire bonds from being damaged. The mold compound 114 also defines a package body. The outer lead sides of the leads 106 project outwardly from the sides of the package body.

In accordance with the present invention, the package 100 has first leads 116 that project from the side of the package body in a first plane, and second leads 118 that project from the side of the package body in a second plane that is parallel to and spaced from the first plane. Also in accordance with the present invention, the second leads 118 includes first and second notches 120 and 122 located at predetermined places along the lead 118 that allow the leads to be bent. In the embodiment shown, the first notches 120 comprise two notches located on opposite surfaces of the leads 118. Similarly, the second notches 122 also comprise two notches located on opposite surfaces of the leads 118. The first notches 120 are located on the inner lead side near to the package body, while the second notches 122 are located on the outer lead side and are spaced from the package body. The leads 116 do not include any notches because, in this embodiment, the leads 116 are not being bent.

The lead frame may be formed of copper or other conductive metals, as is known in the art, and may be supplied in either strip or array form. The lead frame or just selected portions of the lead frame, like outer lead areas of the leads, may be coated or plated with another metal or alloy to inhibit corrosion when the lead frame is exposed to the ambient environment. The lead frame may be formed from a sheet of copper or copper foil by cutting, stamping, and/or etching. In one embodiment, the die receiving area 102 comprises a die pad, that is, a solid piece of copper upon which the die 104 is mounted. In some embodiments, the die pad may be made relatively thick so that it can act as a heat sink, moving heat generated by the die away from the die. As noted above, the notches 120 and 122 facilitate bending by allowing bending of the leads at predetermined locations, yet the force used to bend the leads is dissipated so that the tape formed on the inner lead side that keeps adjacent leads from contacting each other remains adhered to the leads and continues to perform its intended functions.

It now should be apparent that the present invention comprises a lead frame for a dual row QFP, and a dual row QFP incorporating the lead frame. In the dual row QFP, every other lead is bent down and in to form a J-shape lead, while intervening leads are bent down and out into gull-wing shapes and, consequently, edges of adjacent leads that were in close proximity are separated. By including notches in predetermined locations of the J-leads, down-set area can be readily formed, when the mold tooling presses on the leads to change the plane at which the leads extend from the package body. The down-set area ensures that the inner lead portion of the leads is not separated from the tape, and thus, the leads remain spaced from adjacent leads. Thus, while the inner lead portions of all of the leads (J-leads and gull-wing leads) lie in the same plane, the outer lead portions of the J-leads lie in plane that is parallel to and below the plane of the gull-wing leads. Maintaining the inner lead portions of all of the leads in the same plane facilitates wire bonding.

An embodiment of the invention has been described where the exposed portions of the leads have one or more bends in them to form J-shaped or Gull Wing shaped leads. In some alternative embodiments of the invention, the exposed portions have no bends in them and extend straight out from the case to form flat leads. An embodiment of the invention has been described where inner and outer leads alternate on all sides of an IC device. In some alternative embodiments of the embodiment, leads may be placed along some, but not all, sides of an IC device.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The invention claimed is:

1. A lead frame an integrated circuit device, the lead frame comprising:
   a central die receiving area for receiving at least one integrated circuit die; and
   a plurality of leads surrounding the die receiving area and extending outwardly therefrom, wherein each lead has an inner lead area proximate to the die receiving area and an outer lead area distant from the die receiving area, wherein the inner lead area has an electrical connection area proximate to the die receiving area configured for electrical connection to a bonding pad of the at least one integrated circuit die, and wherein the outer lead area extends beyond a package boundary and allows for electrical connection of external circuitry to the at least one integrated circuit die,
   wherein the inner lead area proximate to the outer lead area of at least one of the plurality of leads includes a first notch formed in a surface thereof that facilitates bending of the at least one lead when the at least one lead is subjected to a downward force at the outer lead area.

2. The lead frame of claim 1, further comprising a tape placed over a top surface of the inner lead areas of the leads, and between the first notch and the electrical connection area of the at least one lead, wherein the tape maintains the leads in a first plane and prevents adjacent leads from contacting each other.

3. The lead frame of claim 2, wherein the first notch facilitates bending of the at least one lead, whereby the tape remains adhered to the top surface of the inner lead area in the first plane while the outer lead area is displaced to a second plane that is parallel to and spaced from the first plane.

4. The lead frame of claim 1, wherein the die receiving area comprises a metal die pad.

5. The lead frame of claim 1, further comprising a second notch formed in the inner lead area proximate to the first notch of the at least one lead.

6. The lead frame of claim 5, wherein the first notch is formed in an upper surface of the at least one lead.

7. The lead frame of claim 6, wherein the second notch is formed in a lower surface, opposite the upper surface, of the at least one lead.

8. The lead frame of claim 1, further comprising a second notch formed in the outer lead area of the at least one lead.

9. The lead frame of claim 8, wherein the second notch comprises two notches formed in the outer lead area of the at least one lead.

10. The lead frame of claim 9, wherein the two notches are formed on opposite surfaces of the at least one lead.

11. The lead frame of claim 1, wherein the first notch has a circular cross-section.

12. The lead frame of claim 1, wherein the first notch has a rectangular cross-section.

13. The lead frame of claim 1, wherein the first notch has a triangular cross-section.

14. A packaged integrated circuit die, comprising:
   a central die receiving area for receiving at least one integrated circuit die;
   an integrated circuit die disposed within the die receiving area;
   a plurality of leads surrounding the die receiving area and extending outwardly therefrom, wherein each lead has an inner lead area proximate to the die receiving area and an outer lead area distant from the die receiving area, wherein the inner lead area has an electrical connection area proximate to the die receiving area configured for electrical connection to a bonding pad of the integrated circuit die, and wherein the outer lead area extends beyond a package boundary and allows for electrical connection of external circuitry to the integrated circuit die,
   wherein the inner lead areas proximate to the outer lead areas of a first set of the plurality of leads include a first notch formed in a surface thereof that facilitates bending of the leads of the first set when the leads of the first set are subjected to a downward force at the outer lead areas thereof;
   tape disposed over a top surface of the inner lead areas of the leads, and between the first notches and the electrical connection areas of the leads of the first set, wherein the tape maintains the plurality of leads in a first plane and prevents adjacent leads from contacting each other;
   a plurality of interconnections that electrically connect bonding pads disposed on a top surface of the integrated circuit die with the electrical connection areas of the plurality of leads; and
   a mold compound that covers the integrated circuit die, the plurality of interconnections, the inner lead areas of the plurality of leads, and the tape, wherein the mold compound defines a package body, and the outer lead areas of the plurality of leads project outwardly from sides of the package body.

15. The packaged integrated circuit die of claim 14, wherein the plurality of interconnections comprises bond wires.

16. The packaged integrated circuit die of claim 14, wherein the leads of the first set of leads extend outwardly from the package body in a second plane that is parallel to and spaced from the first plane, and the remaining leads of the plurality of leads extend outwardly from the package body in the first plane.

17. The integrated circuit device of claim 16, wherein the leads of the first set are formed into a J-lead shape, and the remaining leads of the plurality of leads are formed into a Gull Wing shape.

18. The integrated circuit device of claim 17, wherein the leads of the first set comprise alternate ones of the plurality of leads.

19. The integrated circuit device of claim 16, wherein said first notch comprises two notches located proximate to each other in the inner lead area.

20. The integrated circuit device of claim 16, wherein each lead of the leads of the first set includes a second notch located in a surface of the outer lead area that facilitates bending of the outer lead areas thereof when said outer lead areas are subjected to a force of a mold tool.

* * * * *